(12) United States Patent
Urban et al.

(10) Patent No.: US 12,095,362 B2
(45) Date of Patent: Sep. 17, 2024

(54) MARX GENERATOR WITH A PLURALITY OF BRANCHES FOR RESPECTIVE MARX VOLTAGES

(71) Applicant: Diehl Defence GmbH & Co. KG, Überlingen (DE)

(72) Inventors: Jürgen Urban, Erlangen (DE); Michael Sporer, Lauf (DE)

(73) Assignee: Diehl Defence GmbH & Co. KG, Überlingen (DE)

( * ) Notice: Subject to any disclaimer, the term of this patent is extended or adjusted under 35 U.S.C. 154(b) by 0 days.

(21) Appl. No.: 18/178,611

(22) Filed: Mar. 6, 2023

(65) Prior Publication Data

US 2023/0283174 A1    Sep. 7, 2023

(30) Foreign Application Priority Data

Mar. 4, 2022    (DE) .................. 10 2022 000 764.9

(51) Int. Cl.
*H02M 3/06*    (2006.01)

(52) U.S. Cl.
CPC ..................................... *H02M 3/06* (2013.01)

(58) Field of Classification Search
CPC ....................................................... H02M 7/82
See application file for complete search history.

(56) References Cited

U.S. PATENT DOCUMENTS

| | | | |
|---|---|---|---|
| 5,311,067 A | 5/1994 | Grothaus et al. | |
| 9,300,280 B2 * | 3/2016 | Camp | .............. H03K 3/53 |
| 11,209,247 B2 | 12/2021 | Stark et al. | |
| 2005/0285447 A1 | 12/2005 | Mayes et al. | |
| 2015/0102690 A1 | 4/2015 | Camp | |

FOREIGN PATENT DOCUMENTS

| | | |
|---|---|---|
| CN | 103888015 B | 8/2016 |
| DE | 102018004568 A1 | 12/2019 |
| DE | 102021004465 A1 | 12/2022 |

* cited by examiner

*Primary Examiner* — Jeffrey S Zweizig
(74) *Attorney, Agent, or Firm* — Laurence A. Greenberg; Werner H. Stemer; Ralph E. Locher

(57) ABSTRACT

A Marx generator has at least two branches for providing a Marx voltage at an output pole. Each of the branches has a plurality of capacitor stages with voltage poles, cross branches with spark gaps, a last capacitor stage at its output end, and a first capacitor stage connected to an operating voltage. The branches have a common triggering section with a common first capacitor stage, a first adjacent cross branch, and an input pole. Each of the branches has the triggering section and also an individual portion with at least one capacitor stage that is only associated with the branch. A resonator arrangement contains the Marx generator and resonators at the respective output poles of the branches. A radiation arrangement has the resonator arrangement and a multi-feed waveguide with at least two of the resonators for respectively feeding an electromagnetic wave.

14 Claims, 5 Drawing Sheets

MARX GENERATOR WITH A PLURALITY OF BRANCHES FOR RESPECTIVE MARX VOLTAGES

CROSS-REFERENCE TO RELATED APPLICATION

This application claims the priority, under 35 U.S.C. § 119, of German Patent Application DE 10 2022 000 764.9, filed Mar. 4, 2022; the prior application is herewith incorporated by reference in its entirety.

FIELD AND BACKGROUND OF THE INVENTION

The invention relates to a Marx generator and to resonators supplied with Marx voltage by the generator.

German published patent application DE 10 2018 004 568 A1 and its counterpart U.S. Pat. No. 11,209,247 B2 disclose a radiation source for radiating an electromagnetic HPEM microwave pulse. It contains a microwave generator for generating the pulse, the generator having a generator opening for outputting the pulse, and a horn structure for shaping the pulse, the horn structure having an input opening connected to the generator opening for irradiating the pulse and an emission opening for emitting the shaped pulse, the generator containing at least two pulse sources for generating a pulse component each, the pulse being the sum of the pulse components. A radiation device contains a radiation source according to the invention and a control device for the time-synchronized activation of the pulse sources for the emission of their respective pulse components.

From practice, it is known to supply energy to such a radiation source or its pulse sources in the form of resonators by means of one or more time-synchronized Marx generators. Here, the or a Marx voltage is applied to each resonator.

SUMMARY OF THE INVENTION

It is accordingly an object of the invention to provide a Marx generator which overcomes a variety of disadvantages of the heretofore-known devices and methods of this general type and which provides for an improved solution for feeding a radiation source using a Marx generator.

With the above and other objects in view there is provided, in accordance with the invention, a Marx generator, comprising:
at least two branches for delivering a respective Marx voltage at an output terminal of the respective said branch;
each branch of said at least two branches containing:
a plurality of capacitor stages connected in series and each having at least a first voltage pole and a second voltage pole;
respective cross branches, each two adjacent capacitor stages being connected between said first voltage pole of a preceding capacitor stage and said second voltage pole of a succeeding capacitor stage by one of said cross branches, and each of said cross branches including a spark gap;
a final capacitor stage at an output end of the respective said branch, with one voltage pole of said final capacitor stage forming an output pole of the respective said branch; and
a first capacitor stage at an input end of the respective said branch, with one voltage pole of said first capacitor stage being connected to an input pole for supplying an operating voltage;
at least two of said at least two branches having a common triggering section in which said at least two branches coincide with respect to said first capacitor stage and a first adjacent cross branch and an input terminal; and
each of said at least two branches that have said common triggering section also having an individual portion that contains at least one capacitor stage associated only therewith.

In other words, the objects of the invention are achieved with a Marx generator that contains at least two branches, in particular exactly two branches. Each of the branches serves or is set up to deliver a Marx voltage to an associated output pole (potential output) of the branch. The Marx voltage is established here from the output pole (in particular high-voltage potential) to an opposite pole (in particular ground or negative high-voltage potential) of the Marx generator. Each branch therefore has its own output pole. In regular or normal operation of the Marx generator, a Marx voltage is provided at each branch or its output pole.

Each of the branches contains a plurality of capacitor stages connected in series. Each of the capacitor stages has at least a first voltage pole and a second voltage pole. Each of the branches contains cross branches, wherein each two adjacent capacitor stages of a branch are connected between the first voltage pole of the preceding capacitor stage and the second voltage pole of the succeeding capacitor stage by one of the cross branches. Each of the cross branches contains a spark gap. Each of the branches contains a final capacitor stage at its output end. Here, one of the voltage poles forms the output pole of the branch. Each of the branches contains a first capacitor stage at its input end, one of the voltage poles of which is connected to an input pole for feeding in an operating voltage. The operating voltage is also present here between the input pole and an opposite pole, which in particular is identical to the output pole or is conductively connected thereto (in the sense of a real, theoretically ideal conductive connection).

In the Marx generator, at least two of the branches, in particular exactly two of the branches, have a common ignition portion, or trigger portion. The ignition portion is therefore a common part of both branches, which, however, is only present once. In the ignition portion, the at least two of the branches coincide. This is true at least with respect to the first capacitor stage and a first cross branch adjacent the capacitor stage in question, as well as the input pole. Thus, the at least two branches in question have a single common input/input end/input pole, however, this is an input for each individual one of the branches in question. Likewise, they have a single first capacitor stage and a single cross branch in common; these components are thus part of both branches so to speak.

Each of the branches that have an ignition portion then also have an individual portion. In addition to the ignition portion, the individual portion represents the "remainder" of the branch concerned. The individual portion contains at least one capacitor stage assigned only to the individual portion or this branch, optionally also at least one corresponding cross branch. In other words, branches that have an ignition portion are composed of exactly two sub-portions, namely the ignition portion and the individual portion.

With regard to its basic principle, that is to say under isolated consideration of any single branch, the Marx generator is in itself constructed in a customary manner and in this respect contains a plurality of capacitor stages which—in the sense of a Marx generator—are connected in series. In this respect, the capacitor stages can be consecutively numbered as, for example, capacitor stage 1 (first), 2, . . . , N (last). Each of the N capacitor stages has at least one first voltage pole and one second voltage pole. During the operation of the Marx generator, for example positive high-voltage potential +HV of the input pole is applied at the first poles, and negative high-voltage potential −HV of the opposite pole is applied at the second poles. The total voltage of a capacitor stage is then present between its two poles during operation.

As is also customary, the branch of the Marx generator contains cross branches. Each two adjacent capacitor stages of the branch are connected by one of the cross branches. The cross branch leads in each case from the first pole of a preceding capacitor stage to the second pole of a succeeding capacitor stage or connects these two poles (or, vice versa, the second pole to the first pole in each case). In this context, "succeeding" refers to the corresponding sequence of capacitor stages in the series connection, i.e., in the above example to the sequence 1, 2, . . . , N.

In the Marx generator, it is customary for all first voltage poles to be connected in series via charging impedances of a first charging line. Similarly, all second voltage poles are connected in series via charging impedances of a second charging line. In this way, the Marx generator is charged between the same potentials in each case. The cross branches represent open circuits here. In this respect, the capacitor stages are connected in parallel in the charging state of the Marx generator.

The above-mentioned "series connection" of the capacitor stages, however, refers, in contrast hereto, to the discharge process through the conducting or short-circuited cross branches, which is considered essential in this respect. The charging impedances act here like an open circuit in each case.

In order to establish the corresponding open circuit during the charging process and the short circuit during the discharging process, and thus the series connection, each of the cross branches contains a spark gap which short-circuits in the event of its breakdown.

The ignition portion thus contains at least one capacitor stage and at least one cross branch, which are connected to the charging lines. The branches are then divided, in particular the common charging lines of the ignition portion branch into respective individual charging lines for the individual portions.

Via the ignition portion, the branches branching off from it are coupled in respect of the ignition of all spark gaps in the associated cross branches. Thus, a synchronized activation of the Marx generator takes place in the relevant branches. The Marx voltages provided by the relevant branches are provided in a time-defined synchronized manner.

In a preferred embodiment, one of the cross branches of the Marx generator branches off from the ignition portion into the individual portions of the associated branches. A breakdown or short circuit of the spark gap in this cross branch thus leads to a short circuit between the ignition portion and all individual portions of the associated branches branching off from the ignition portion. In particular, one of the two electrodes of the spark gap in this cross branch is, for this purpose, connected to a voltage pole of the capacitor stage in the ignition portion facing the branch. The other of the two electrodes is connected to one of the voltage poles of the succeeding capacitor stages in the individual portions. In this way, an ignition process of the Marx generator initiated in the ignition portion is reliably forwarded to all individual portions branching off from it, so that the cross branches or their spark gaps in the individual portions also ignite reliably and in particular simultaneously. In other words, one electrode of the spark gap is connected to the ignition portion, the other electrode to all individual portions.

In a preferred embodiment, the spark gaps of the cross branches and/or the capacitor stages in the branches are coordinated with each other in such a way that, during the regular operation of the Marx generator, at least one of the spark gaps in the ignition portion ignites before all other spark gaps. In particular, two or more or all of the spark gaps present in the ignition portion ignite correspondingly before all other spark gaps in the individual portions. The earlier ignition can be realized, for example, by a lower ignition voltage of the one or more spark gaps which are to ignite before other spark gaps. This ensures that the ignition of the Marx generator is divided into the individual portions starting from the ignition portion, which leads to a particularly good simultaneity of the provision of the Marx voltages.

In a preferred embodiment, the branches coincide not only with respect to the first capacitor stage, but also with respect to at least one further capacitor stage which follows the first capacitor stage (second, third, fourth . . . capacitor stage). Furthermore, in this case, the branches also coincide with in respect of the cross branches located between the common capacitor stages. The ignition portion then contains a number of G (>1) capacitor stages and at least G−1 cross branches, each of which is arranged between two of the G capacitor stages common to the relevant branches in the ignition portion. The branches are then divided, in particular the common charging lines of the ignition portion branch into respective individual charging lines for the individual portions.

In a preferred embodiment, at least two of the branches are dimensioned in such a way that, during the operation of the Marx generator, the Marx voltages are provided simultaneously at their output poles. Thus, not only a time synchronization but also a simultaneity of the Marx voltages can be achieved. In particular, a time course of the Marx voltages is thus synchronized in phase. This is particularly suitable for operating resonators as pulse sources of the above-mentioned microwave generator of DE 10 2018 004 568 A1 and U.S. Pat. No. 11,209,247 B2. This microwave generator can contain waveguides in which the resonators are arranged as pulse sources. In this respect, the generator can also be referred to as a parallel-feed waveguide or multi-feed waveguide.

In this respect, DE 10 2018 004 568 A1 (U.S. Pat. No. 11,209,247 B2) thus describes pulse sources for the emission in each case of a pulse component. Each of the pulse sources can be represented, for example, by a resonator. With reference to the present invention, then, for example, each of the resonators (in particular, two resonators are considered here) is fed by an output pole of the Marx generator according to the invention. The Marx generator thus then contains exactly two branches, each with an output. The time synchronization of the two pulse sources takes place via the ignition portion. In this respect, in particular, reference is made to DE 10 2018 004 568 A1 (U.S. Pat. No. 11,209,247 B2), the entire contents of which are hereby incorporated by reference.

In a preferred embodiment, at least two of the branches, in particular all of the branches, have an identical Marx structure. The "Marx structure" is intended to include all those features that are important in respect of the realisation of the Marx principle in the Marx generator. In particular, this concerns the same number of capacitor stages and spark gaps in the relevant branches, as well as the dimensioning of the components involved (capacitances, breakdown voltages, dimensions of components, lengths of lines, etc.). This leads to a further-improved synchronization or equality of the Marx voltages generated in the Marx generator.

In a preferred embodiment, the first capacitor stage (i.e. the one following the input pole in the ignition portion) is connected to the input pole in respect of or via at least one of the above-mentioned charging lines via an above-mentioned charging impedance. Thus, the first capacitor stage is also adapted to the remaining capacitor stages with regard to a relevant charging characteristic from the input pole.

In a preferred embodiment, the Marx generator contains—in addition to the previously mentioned N−1 cross branches—a further input cross branch which is common to the branches of the Marx generator since it is arranged in the ignition portion between the input pole or its opposite pole and the first capacitor stage. Thus, the first capacitor stage is already connected to the input pole via an (input) cross branch. The input cross branch is an additional cross branch that is added to the number of cross branches in respect of the above-mentioned considerations.

In a preferred embodiment, the capacitor stages of the ignition portion each have a greater capacitance than the remaining capacitor stages individually. This refers to the particular capacitance of an individual capacitor stage ("on its own"), not to total capacitances in a branch or portion. The energy stored correspondingly in the ignition portion (in its capacitor stages) can then be distributed to the individual portions when the Marx generator is activated (ignition of the spark gaps). In particular, the capacity of a capacitor stage of the ignition portion is twice as large as that of a capacitor stage in the individual portions. This applies in particular to two branches or individual portions.

In a preferred embodiment, the capacitor stages of at least one of the branches are arranged spatially along a line of progression. The last capacitor stage of the branch and the output pole are located at one end of the line of progression. At the other end is the first capacitor stage and the opposite pole to the output pole. The distance between the output pole and its opposite pole is smaller than the longitudinal extent of the branch along the line of progression.

Each branch of the Marx generator is thus designed analogously with regard to its capacitor stages in accordance with our copending patent application Ser. No. 17/902,072, entitled "Pulse Generator for an HPEM Pulse," and which is herewith incorporated by reference in its entirety. The copending application corresponds to, and claims the priority of, German patent application DE 10 2021 004 466.5, filed on Sep. 2, 2021. In other words, the capacitors in the form of capacitor stages are also spatially arranged in the present case along a line of progression, at one end of which there is an output pole and at the other end of which there is an opposite pole for the Marx voltage, the distance between the output pole and the opposite pole being smaller than the longitudinal extent of the Marx generator (branch) along the line of progression. The basic principle of such an arrangement along a line of progression (circle, S-shape, zig-zag) is explained in application Ser. No. 17/902,072 (DE 10 2021 004 466.5), in particular with reference to FIGS. 2-5 and the associated description. In this respect, reference is made to application DE 10 2021 004 466.5 and its counterpart Ser. No. 17/902,072, the content of which is hereby incorporated in this application. The relevant disclosure content of the German and US applications is incorporated insofar as the does not conflict with the present application, in particular with the present addition of the ignition portion. In particular, the content concerning the resonator proposed below and its arrangement with respect to the line of progression/the capacitor stages is also incorporated, mutatis mutandis.

The object of the invention is also achieved by a resonator arrangement, as claimed. The arrangement contains a Marx generator according to the invention with at least two resonators, each of the resonators being connected to a dedicated output pole of one of the branches. In the corresponding branches, one resonator per branch is thus always arranged or is connected to its output pole (and the opposite pole).

Due to the time-synchronized ignition of the Marx generator, the generated Marx voltages are also provided to the resonators in a time-synchronized manner, in particular simultaneously.

The resonator arrangement and at least some of its possible embodiments as well as their respective advantages have already been explained analogously in conjunction with the Marx generator according to the invention.

The object of the invention is also achieved by a radiation arrangement, as claimed. This contains a resonator arrangement according to the invention and a multi-feed waveguide containing at least two of the resonators, each for feeding an electromagnetic wave. The multi-feed waveguide is in particular—as mentioned above—as a plurality of waveguides (in particular two) part of the generator of DE 10 2018 004 568 A1 and U.S. Pat. No. 11,209,247 B2.

The radiation arrangement and at least some of its possible embodiments as well as their respective advantages have already been explained analogously in conjunction with the resonator arrangement according to the invention.

In a preferred embodiment, for at least two of the branches, each of these branches at least partially surrounds one of the resonators; and the ignition portion runs between the resonators. This results in a particularly advantageous geometrical arrangement of the branches. In particular, the arrangement concept for capacitor stages is implemented here, as is known for capacitors from application Ser. No. 17/902,072 (DE 10 2021 004 466.5). The line of progression described there thus surrounds or encircles the resonator in question. In the present case, in the ignition portion the lines of progression are congruent in particular.

In a preferred variant of this embodiment, the branches are arranged axially symmetrical to an axis of symmetry running between the resonators. The ignition portion runs here along the line of symmetry. Then the individual portions divide symmetrically from there. In other words, the lines of progression also run axially symmetrical to the corresponding axis of symmetry. In particular, the line of progression in the region of the ignition portion is a straight line that coincides with the axis of symmetry. Thus, a particularly advantageous arrangement for feeding two resonators in a low-inductance manner results from two parts or branches or output poles of the Marx generator according to the invention. Here, too, the Marx generator is embodied in particular with exactly two branches.

The invention is based on the following findings, observations and considerations and also features the following preferred embodiments. These embodiments are also referred to in part as "the invention" for the sake of simplicity. The embodiments may also contain or correspond to parts or combinations of the above-mentioned embodiments and/or may also include embodiments not previously mentioned.

The invention—without limiting its generality and merely by way of example—is also explained here in greater detail using a parallel-feed waveguide, as is known, for example, from the above-mentioned documents DE 10 2018 004 568 A1 and U.S. Pat. No. 11,209,247 B2 as a generator with two pulse sources in the form of resonators. However, the invention can be applied to any Marx generators of which the output voltages are to be provided in a time-synchronized manner.

The invention is based on the consideration that the radiation source known from DE 10 2018 004 568 A1 and U.S. Pat. No. 11,209,247 B2 must be supplied with electrical energy. It would be conceivable to use a Marx generator for this purpose. For example, in the case of two pulse sources in the form of two resonators, the following would then be conceivable: The two resonators of a horn antenna with parallel-feed waveguide increase the high-frequency power fed into the antenna by ideally a factor of 2 compared to a resonator with comparable operating parameters. What is known from practice so far is to build Marx generators in a linear arrangement and to design these in their output capacitance for one to N resonators. For example, a Marx generator could charge the two resonators to high voltage as quickly as a (linear) Marx generator could charge a single resonator. Thus, the two resonators would provide approximately twice the high-frequency pulse power, which—with the same antenna aperture—could radiate almost with square root of 2 times the field strength. This means that a range of almost square root of 2 times is possible.

The invention is now based on the realization that by the operation with a common, linear Marx generator, the charging speed of the two resonators is, however, relatively slow. Another finding is: According to the so-called time-area law according to Dieter Kind from 1957 (Kind, "Die Aufbaufläche bei Stoßspannungsbeanspruchung technischer Elektrodenanordnungen in Luft" ("The build-up area with impulse voltage loading of industrial electrode arrangements in air"), dissertation text, TH München, 1957) the following is known: The voltage-time area from exceeding the DC breakdown voltage of a spark gap is constant. Similarly, if this DC breakdown voltage is exceeded in a very fast pulse, the actual breakdown voltage is significantly increased. This leads to a larger HF amplitude in the case of spark-gap-based resonators.

The following additional conclusion can be drawn from DE 10 2018 004 568 A1 and U.S. Pat. No. 11,209,247 B2: The power coupling in HPEM antenna systems can be increased by combining resonators and thus the radiated field strength and range can be increased by approximately the square root of the number of resonator systems. However, the number of resonators must ignite in phase. In the case of two resonators in a parallel-feed waveguide, for example, they must ignite simultaneously.

The invention is now based on the idea that this simultaneous ignition could be achieved by the common rapid charging by a common Marx generator.

Application Ser. No. 17/902,072 (DE 10 2021 004 466.5) proposes a concept (also called "coaxial Marx generator/coaxial Marx/ring Marx") to increase the power of a single resonator by connecting the Marx generator to the resonator with extremely low inductance. The following insight is gained from this: This is achieved by winding the Marx generator quasi coaxially around the resonator, for example. The electrical circuit remains identical here to a linear Marx generator. The higher field strength results solely from the lower inductance of the Marx generator including the wiring to the resonator and thus the faster charging pulse at the resonator, which produces a higher ignition voltage and a higher HF amplitude analogous to the voltage-time area law according to [Kind 1957, see above].

The following finding has also emerged from practical experience: With a coaxial Marx generator, the measured increase in field strength and thus range, depending on the type and number of stages of a linear Marx generator as a basis for comparison, is approximately a factor of 2. This corresponds to an increase in the HF power of the radiated field by a factor of 4 or 6 dB. The power factor 4 (achieved with only one resonator and one coaxial Marx generator) would already require 4 perfectly synchronized and phase-true resonators with a parallel-feed waveguide and the use of previous linear Marx generators.

According to the invention, the low-inductance concept of a coaxial Marx generator for single resonators can now also be used, for example, for the two resonators of a horn antenna with parallel-feed waveguide. Thus, the power of each of the two resonators can be raised close to the maximum possible in single resonator operation, in order to be able to convert or use approximately twice the number of resonators into twice the power fed into the antenna.

According to the invention, therefore, a double coaxial Marx generator in particular is suitably arranged around two resonators. According to the invention, the advantage of low-inductance coaxial Marx generators according to application Ser. No. 17/902,072 (DE 10 2021 004 466.5) can be shared with the advantage of two resonators in a parallel-feed waveguide according to DE 10 2018 004 568 A1 and U.S. Pat. No. 11,209,247 B2. The Marx generator according to the invention is therefore referred to as a "double coaxial Marx generator."

The "double coaxial Marx generator" according to the invention starts with the ignition of at least one first, in particular the first three (or more) common stages (in the ignition portion) and thus stabilizes the timing. Subsequently, the further voltage increase divides into two (in particular smaller) Marx generator limbs/branches (individual portions), which wind around the two resonators in particular like an "8" or double coaxial.

The invention is also based on the realization that a classical linear Marx generator usually multiplies the input voltage according to the number of stages, but in a linear chain. The term linear is to be understood here in circuit terms, not geometrically. The coaxial Marx is also linear with regard to the electrical circuit and thus identical to the circuit of the Marx generators described as geometrically linear.

According to the invention, after a certain number of stages, e.g. three stages, namely at the end of the ignition portion, the Marx generator is divided into a plurality of, in particular two, branches with further stages (individual portions, e.g. 9 stages per individual portion), and the divided branches wind themselves around the two resonators, in particular analogously to application Ser. No. 17/902,072 (DE 10 2021 004 466.5), e.g. in the "2-fold parallel feed" configuration according to DE 10 2018 004 568 A1 and U.S. Pat. No. 11,209,247 B2.

This double-coaxial configuration makes it possible to charge the two resonators quickly and as simultaneously as possible. This allows the resonators to ignite with a high individual amplitude and as phase-synchronously as possible, and allows the field amplitudes to be added together.

For example, the invention could be incorporated as a performance-enhancing component for a HPEM source for drone defense (C-UAS: Countering Unmanned Aerial System, or CUAV: Countering Unmanned Aerial Vehicle).

According to the invention, this results in a double-coaxial Marx generator for a parallel-feed waveguide—in particular a low-inductance one, in the case of a ring arrangement of a Marx generator according to application Ser. No. 17/902,072 (DE 10 2021 004 466.5). The parallel-feed waveguide with a plurality of resonators on a common horn antenna according to DE 10 2018 004 568 A1 and U.S. Pat. No. 11,209,247 B2 increases the radiated field strength.

Other features which are considered as characteristic for the invention are set forth in the appended claims.

Although the invention is illustrated and described herein as embodied in a Marx generator with a plurality of branches for respective Marx voltages, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
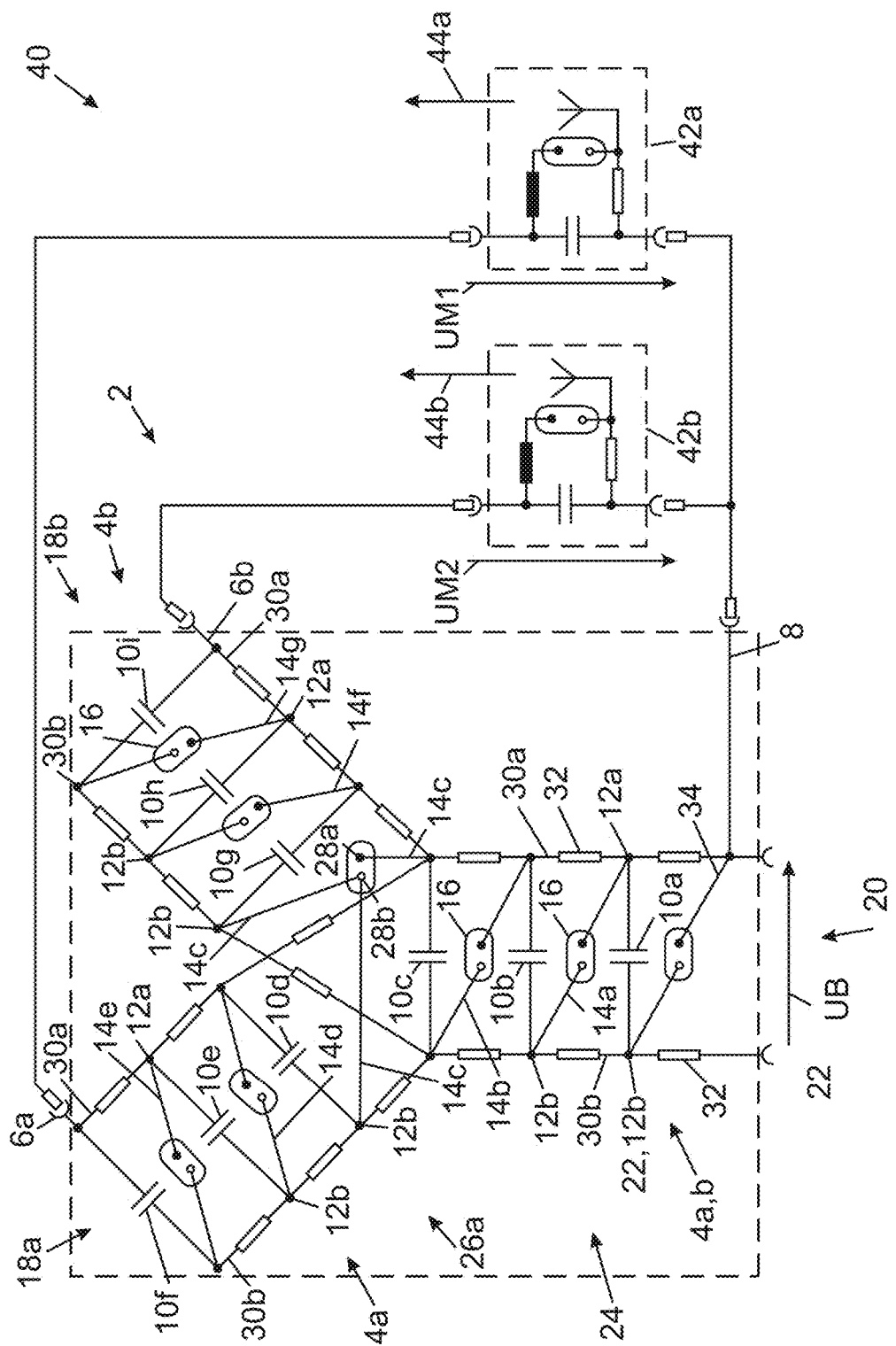
FIG. 1 shows a circuit diagram of a Marx generator with two branches supplying energy to two resonators.

Referring now to the figures of the drawing in detail and first, in particular, to FIG. 1 thereof, there is shown a circuit diagram of a Marx generator 2. The Marx generator 2 has two branches 4a,b. Each of the two branches 4a,b serves to output a respective Marx voltage UM1,2. Each of the two branches 4a,b serves to output a respective Marx voltage UM1,2. For this purpose, each of the branches 4a,b has a respective output pole 6a,b to which a potential corresponding to the Marx voltage UM1,2 is applied during operation of the Marx generator 2. To be more precise, the Marx voltage UM1,2 is then set between the respective output pole 6a,b and an opposite pole 8. Each of the branches 4a,b contains several capacitor stages 10, in this case six each (in the sense of a Marx generator) connected in series. Branch 4a contains the capacitor stages 10a-f, branch 4b contains the capacitor stages 10a-c and 10g-i. Each of the capacitor stages 10 contains a first voltage pole 12a and a second voltage pole 12b.

Each of the branches 4a,b further contains five cross branches 14. The branch 4a contains the cross branches 14a-e, the branch 4b contains the cross branches 14a-c and 14f-g. Two adjacent capacitor stages 10 are each connected by one of the cross branches 14. Each of the cross branches 14 leads from the first voltage pole 12a of the respective preceding capacitor stage (counting order from the input pole 22 (see below) to the output pole 6a,b, here in the order of ascending letters) to the second voltage pole 12b of the respective following capacitor stage 10. For example, the cross branch 14a leads from the first pole 12a of the first capacitor stage 10a to the second pole 12b of the second capacitor stage 10b.

Each of the cross branches 14 contains a spark gap 16. Each of the branches 4a,b contains a last capacitor stage 10, in the case of branch 4a this is capacitor stage 10f, in the case of branch 4b capacitor stage 10i. The respective voltage pole 12a of the respective last capacitor stage 10f,i forms the respective output pole 6a,b of the branches 4a,b.

The Marx generator 2 or each branch 4a,b individually is constructed in the manner of a standard Marx generator: This means that all voltage poles 12a are connected to each other via respective charging lines 30a via charging impedances 32. Likewise, the voltage poles 12b are connected via a charging line 30b and respective intermediate charging impedances 32.

Each of the branches 4a,b also contains a first capacitor stage 10a, which is identical for both branches 4a,b here. This results in a respective output end 18a,b at the capacitor stages 10f,i and at the output poles 6a,b, respectively, as well as an input end 20 (identical for both branches 4a,b) at the capacitor stage 10a and at an input pole 22 for both branches 4a,b. One pole of the first capacitor stage 10a, here the pole 12b, is connected to the input pole 22 for feeding in an operating voltage UB. The operating voltage UB is also applied between the input pole 22 and an opposite pole 8 (here identical to that above for the output poles 6a,b).

Both the Marx voltages UM1,2 and the operating voltage UB are therefore each related to a potential of the opposite pole 8. In the present case, the opposite poles 8 coincide for both the input pole 22 and the output poles 6a,b.

The two branches 4a,b have a common triggering section 24. In the triggering section 24, which may also be referred to as a firing section, a triggering portion, a firing portion, the two branches 4a,b coincide as follows: They have the first to third capacitor stages 10a-c together as well as the two intermediate cross branches 14a,b and thus also the first cross branch 14a adjacent to the first capacitor stage 10a. The two branches 4a,b in the ignition portion 24 also have the input terminal 22 together or coincide with respect to this.

The branches 4a,b therefore also coincide not only with regard to the first capacitor stage 10a, but also with regard to the two subsequent capacitor stages 10b,c. They also coincide with regard to the cross branches 14a,b located between the common capacitor stages 10a-c.

In addition to the ignition portion 24, each of the branches 4a,b also has a respective individual portion 26a,b which contains further capacitor stages 10. The capacitor stages 10d-f are assigned to the individual portion 26a, the capacitor stages 10g-i to the individual portion 26b. In the example, the respective intermediate cross branches 14d,e are also assigned to the individual portion 26a and the cross branches 14f,g to the individual portion 26b.

One of the cross branches, namely the cross branch 14c, branches off from the ignition portion 24 into the individual portions 26a,b. This is achieved as follows: One electrode 28a of the associated spark gap 16 is connected to the voltage pole 12a of the capacitor stage 10c of the ignition portion 24. The other electrode 28b is connected to the second voltage pole 12b of the capacitor stage 10d of the individual portion 26a and the second voltage pole 12b of the capacitor stage 10g of the individual portion 26b.

The spark gaps 16 of the cross branches 14a-g and the capacitor stages 10a-i are coordinated with each other in such a way that in regular operation of the Marx generator 2 at least one of the spark gaps 16 in the ignition portion 24 ignites before all other spark gaps 16 of the Marx generator 2. This ensures that the ignition of the Marx generator continues simultaneously and uniformly from the ignition portion 24 into the individual portions 26a,b.

The branches 4a,b are dimensioned in such a way that during operation of the Marx generator 2 the Marx voltages UM1,2 are simultaneously provided at their output poles 6a,b. This is achieved by symmetrical dimensioning of all components in the branches 4a,b as well as the same number of capacitor stages 10 and cross branches 14 as well as the same capacities and switching characteristics of these. This also applies to the dimensioning of the charging lines 30a,b with their charging impedances 32.

In this respect, the two branches 4a,b have identical Marx structures, i.e. they are identical "single Marx generators" in terms of circuitry and dimensioning.

In the present case, the first capacitor stage 10a is additionally connected with respect to the charging lines 12a,b via further charging impedances 32 to the potential input 22 and the opposite pole 8.

Likewise, in the present case, the Marx generator 2 has a further input cross branch 34 common to the branches 4a,b, which extends between the input for the operating voltage UB (input pole 22, opposite pole 8), here the opposite pole 8, and the first capacitor stage 10a, here its voltage pole 12b.

In the present case, each of the capacitor stages 10a-c of the ignition portion 24 has a larger capacitance, namely twice the capacitance, than each of the remaining capacitor stages 10d-i, each individually.

FIG. 1 also shows a resonator arrangement 40, which contains the Marx generator 2 and two resonators 42a,b. Each of the resonators 42a,b is connected to a respective output pole 6a,b of one of the branches 4a,b (and the opposite pole 8). In operation, therefore, the resonators 42a,b are energised by the two Marx voltages UM1,2 from the branches 4a,b of the Marx generator 2 to output a respective electromagnetic wave 44a,b. The latter is shown in FIG. 1 only symbolically. The latter is only symbolically indicated by an arrow in FIG. 1.

Two electrical circuits in FIG. 1 are thus formed by the Marx generator 2 and the resonators 42a,b each connected to the output end 18a,b with an integrated antenna (shown symbolically) for radiating the waves 44a,b. The antenna is an integrated monopole antenna for waveguide coupling, i.e. coupling into the waveguides of the waveguides 52. The antenna is an integrated monopole antenna for waveguide coupling, i.e. coupling of the waves 44a,b into the waveguides of the waveguides 52.

Figure 2:
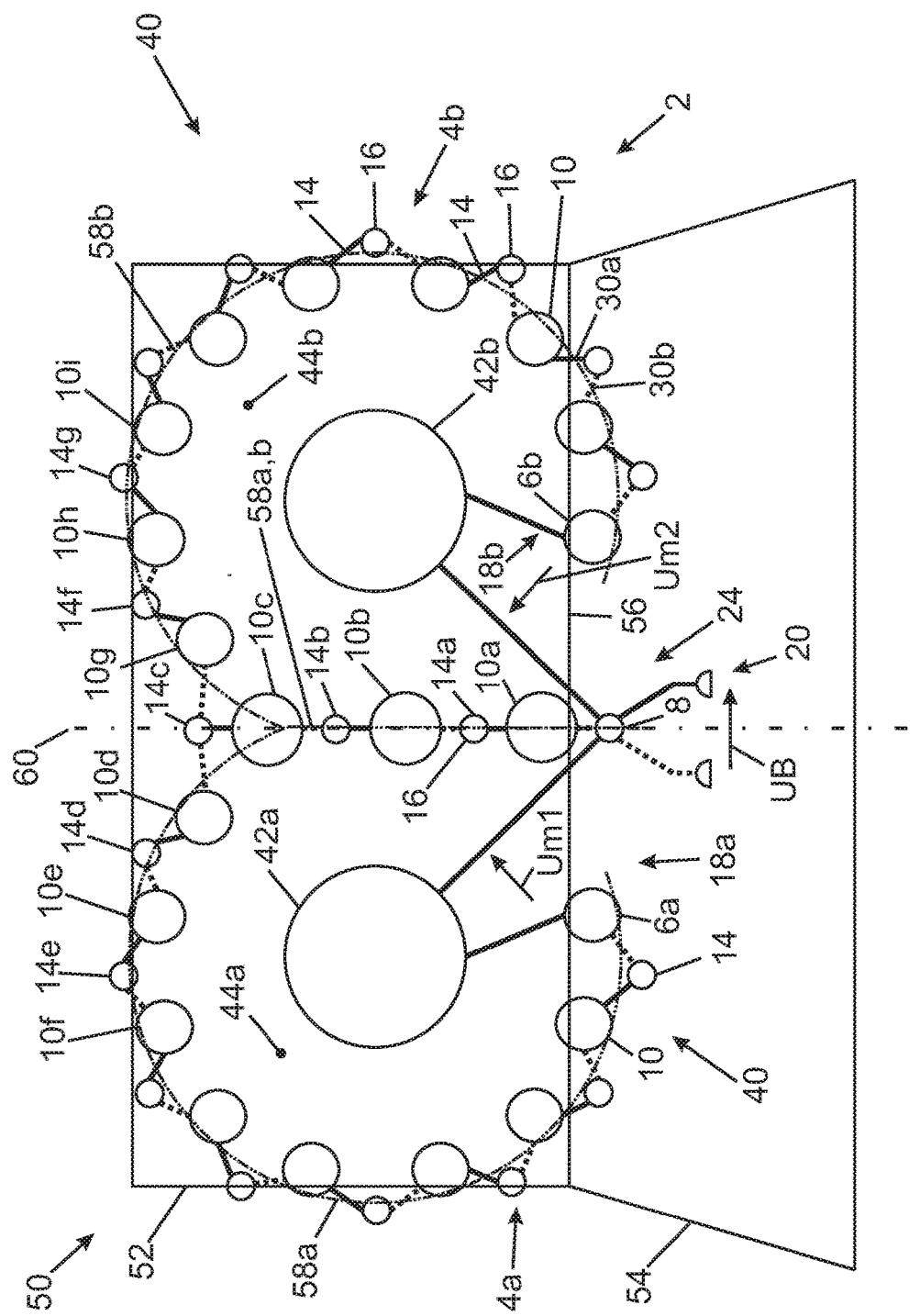
FIG. 2 shows a symbolic view from below of a radiation arrangement with an alternative Marx generator.

FIG. 2 shows a radiation arrangement 50 containing a resonator arrangement 40 which corresponds in principle to that of FIG. 1, but which is alternatively designed as follows: Its Marx generator 2 differs from that of FIG. 1 in that the branches 4a,b do not end with the respective capacitor stage 10f or 10i, but are followed by six further capacitor stages 10 and six cross branches 14 per branch 4a,b until the output ends 18a,b with the corresponding output poles 6a,b are finally reached. Otherwise, the resonator arrangement 40 is identical to FIG. 1.

In addition to the resonator arrangement 40, the radiation arrangement 50 also contains a waveguide 52, in this case a multi-feed waveguide. This contains the two resonators 42a,b of the resonator arrangement 40. The resonators 42a,b serve here for the respective feed of the waves 44a,b into the waveguide 52. A horn structure 54 is connected to the waveguide 52, which are connected to each other via a connection opening 56. In operation, the waves 44a,b exit via the connection opening 56 into the horn structure 54 and superimpose and are radiated via which horn structure 54 in a manner not explained in more detail. This results in a radiation source comparable to those of DE 10 2018 00456 8 A1.

In this embodiment, the capacitor stages of the branches 4a,b are arranged spatially along a respective line 58a,b (shown double-dashed in the figure), which here has or follows a circular shape flattened on one side and thus has a straight section at the "beginning". This concerns the three capacitor stages 10a-c in the ignition portion 24. The output pole 6a,b or the respective output end 18a,b is located at the respective "end" of the course line 58a,b, and the opposite pole 8 or the input end 20 is located at the respective beginning. The distance between the respective output pole 6a,b and the opposite pole 8 is smaller in each case than the longitudinal extent of the branch 4a,b along the course line 58a,b.

The two branches 4a,b thus partially surround the respective resonators 42a,b along the course lines 58a,b. The ignition portion 24 runs between the resonators 42a,b. With respect to an axis of symmetry 60, the branches 4a,b are arranged axially symmetrically. The axis of symmetry 60 coincides with the respective common straight course section of the course lines 58a,b in the ignition portion 24.

FIG. 2 thus shows a so-called double coaxial Marx generator 2 in which the capacitors of the capacitor stages 10, symbolically indicated here as circles, are arranged around the two resonators 42a,b (along the respective line 58a,b). The respective capacitors or capacitor stages 10a-c have (considered individually for each capacitor stage 10) a larger, here double, capacitance than the respective remaining capacitor stages 10. The spark gaps 16 are also shown here symbolically as circles in the cross branches 14. The charging lines 30a,b are shown here only symbolically and actually run completely above the paper plane (charging line 30b, bold dotted) and below the paper plane (charging line 30a, shown bold drawn out). They are each shown only halfway, which is functionally intended to represent the discharge of the Marx generator 2 via the cross branches 14.

Figure 3A:
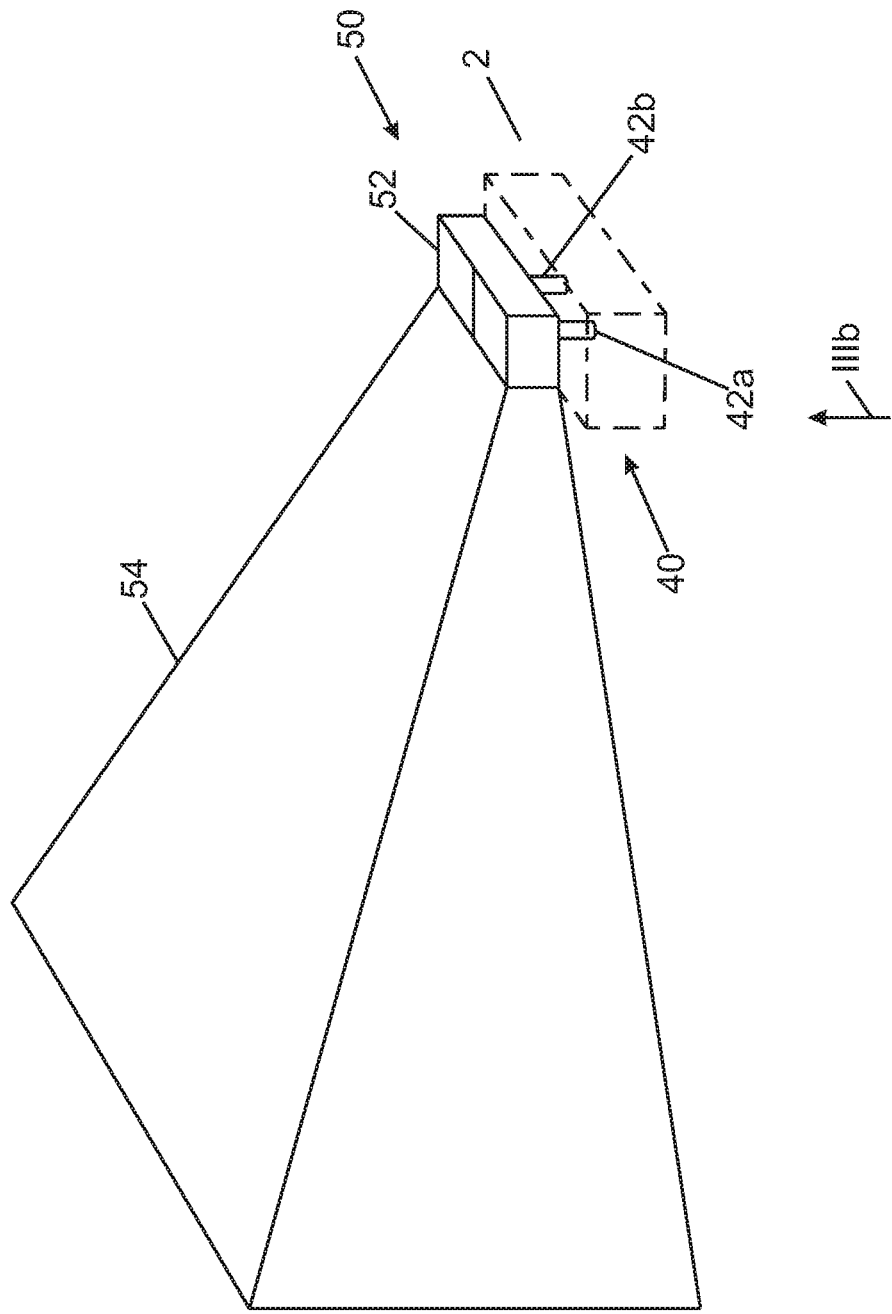
FIG. 3A shows a simplified view of the radiation arrangement from FIG. 2, viewed obliquely from above.
Figure 3B:
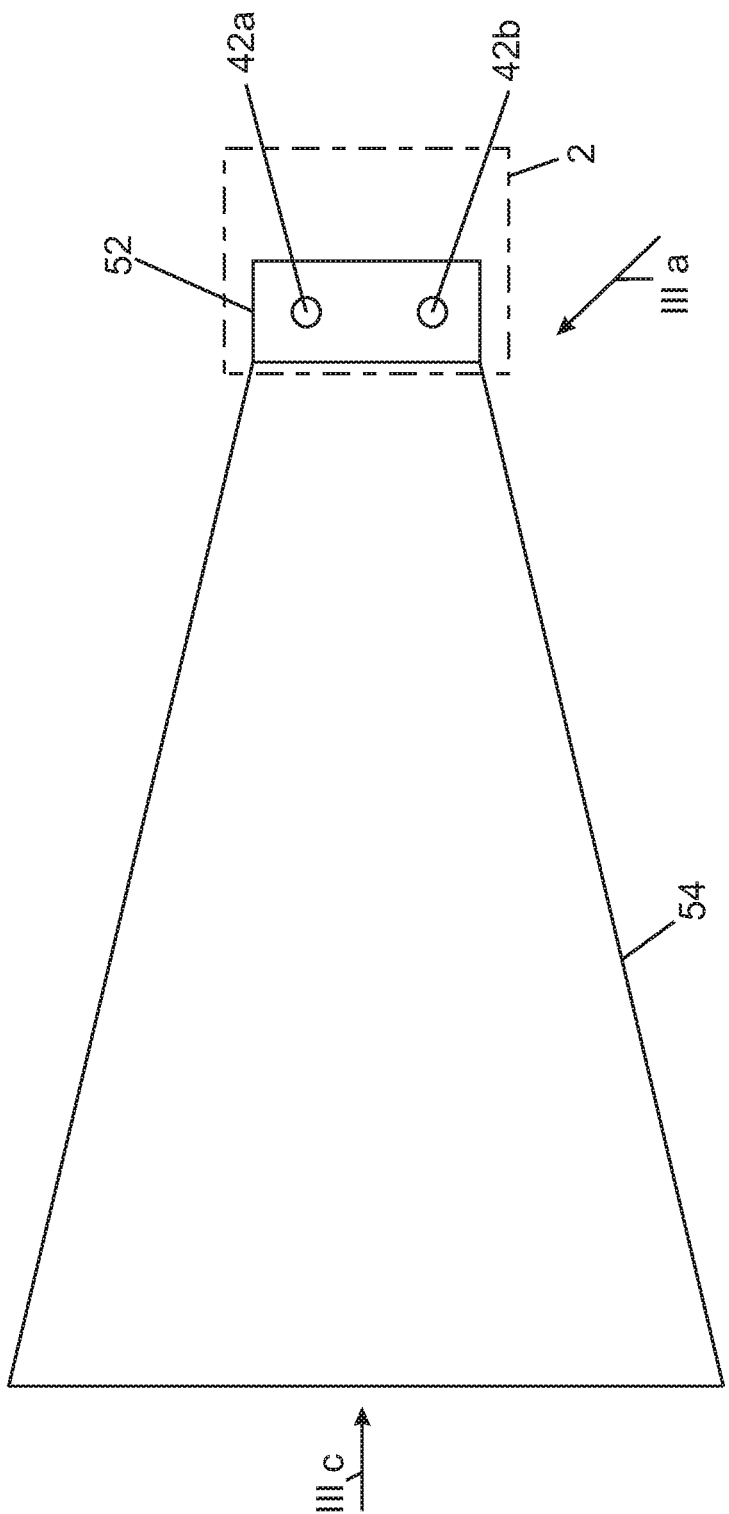
FIG. 3B shows a bottom view.
Figure 3C:
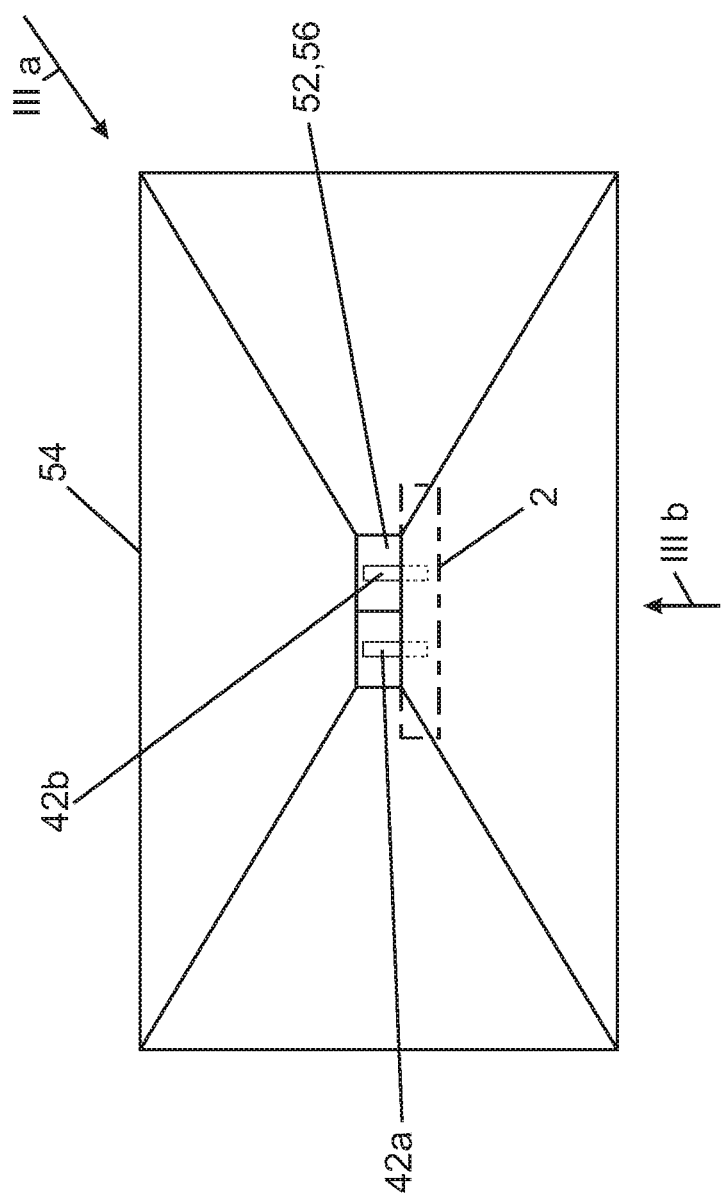
FIG. 3C shows a front view.

FIG. 3 shows the radiation arrangement 50 from FIG. 2 in perspective, but symbolic view, in that the Marx generator 2 is only symbolically indicated by a dotted cuboid. FIG. 3 shows the entire horn structure 54. FIG. 3A shows an oblique view from the top rear in the direction of view of arrows IIIa, FIG. 3B a view from below (direction of view of arrows IIIb) corresponding to FIG. 2. FIG. 3C is a view from the front (direction of view of the arrows IIIC). The resonators 42a,b are identical resonators for waveguide antennas. The multi-feed waveguide 52 is here formed by two individual waveguides arranged side by side (parallel waveguide), each with a resonator 42a,b, which are charged by the common Marx generator 2 with a high-voltage pulse. The horn structure 54 is here a horn funnel.

In FIGS. 3A and 3B, the Marx generator 2 is visible and is only indicated by a dashed line to provide a view of the resonators 42a,b. In FIG. 3C, the Marx generator 2 is actually not visible as it is covered by the horn structure 54.

The following is a summary list of reference numerals and the corresponding structure used in the above description of the invention:

2 Marx generator
4a,b Branch
6a,b Output pole
8 Opposite pole
10a-i Capacitor stage
12a,b Voltage pole
14a-g Cross branch
16 Spark gap
18a,b Output end
20 Input end
22 Input pole 24 Ignition section
26a,b Single section
28a,b Electrode
30a,b Charge line
32 Charge impedance
34 Input cross branch
40 Resonator arrangement
42a,b Resonator
44a,b Wave
50 Radiation arrangement
52 Waveguide
54 Horn structure
56 Junction opening
58a,b Course line
60 Symmetry axis
UM1,2 Marx voltage
UB Operating voltage

The invention claimed is:

1. A Marx generator, comprising:
at least two branches for delivering a respective Marx voltage at an output terminal of the respective said branch;
each branch of said at least two branches containing:
a plurality of capacitor stages connected in series and each having at least a first voltage pole and a second voltage pole;
respective cross branches, each two adjacent capacitor stages being connected between said first voltage pole of a preceding capacitor stage and said second voltage pole of a succeeding capacitor stage by one of said cross branches, and each of said cross branches including a spark gap;
a final capacitor stage at an output end of the respective said branch, with one voltage pole of said final capacitor stage forming an output pole of the respective said branch; and
a first capacitor stage at an input end of the respective said branch, with one voltage pole of said first capacitor stage being connected to an input pole for supplying an operating voltage;
at least two of said at least two branches having a common triggering section in which said at least two branches coincide with respect to said first capacitor stage and a first adjacent cross branch and an input terminal; and
each of said at least two branches that have said common triggering section also having an individual portion that contains at least one capacitor stage associated only therewith.

2. The Marx generator according to claim 1, wherein one of said cross branches branches from said triggering section into the individual portions.

3. The Marx generator according to claim 1, wherein said spark gaps of said cross branches and/or said capacitor stages are matched to one another so that, in regular operation of the Marx generator, at least one of said spark gaps in said triggering section ignites before all other spark gaps.

4. The Marx generator according to claim 1, wherein said branches also coincide with respect to at least one of said capacitor stages following the first capacitor stage and also with respect to said cross branches located between said capacitor stages.

5. The Marx generator according to claim 1, wherein at least two of said branches are dimensioned so that during an operation of the Marx generator the Marx voltages are provided simultaneously at the respective said output poles.

6. The Marx generator according to claim 1, wherein said at least two branches have an identical Marx structure.

7. The Marx generator according to claim 1, wherein said first capacitor stage is connected with respect to at least one charging line via a charging impedance to said input terminal.

8. The Marx generator according to claim 1, which comprises a further input cross branch common to said branches between said input pole or an opposite pole and said first capacitor stage.

9. The Marx generator according to claim 1, wherein each of said capacitor stages of said triggering section has a greater capacitance than the remaining said capacitor stages individually.

10. The Marx generator according to claim 1, wherein said capacitor stages of at least one of said branches are arranged spatially along a line of progression, said output pole is located at one end said line of progression and an opposite pole is located at another end of said line of progression, and wherein a distance between said output pole and said opposite pole is smaller than a longitudinal extent of said branch along said line of progression.

11. A resonator assembly, comprising a Marx generator according to claim 1 and at least two resonators, each of said at least two resonators being connected to a respective output pole of one of said branches of said Marx generator.

12. A radiation arrangement, comprising:
a resonator assembly having a Marx generator according to claim 1 and at least two resonators, each of said at least two resonators being connected to a respective output pole of one of said branches of said Marx generator; and
a multi-feed waveguide having at least two of said resonators for respectively feeding an electromagnetic wave.

13. The radiation arrangement according to claim 12, wherein for at least two of the branches, each of the branches surrounds one of the resonators at least partially and the triggering section extends between the resonators.

14. The radiation arrangement according to claim 13, wherein the branches are arranged axisymmetrically relative to an axis of symmetry extending between the resonators.

* * * * *